United States Patent [19]
Ishida et al.

[11] Patent Number: 5,831,898
[45] Date of Patent: Nov. 3, 1998

[54] STATIC RANDOM ACCESS MEMORY SEMICONDUCTOR LAYOUT

[75] Inventors: Minoru Ishida; Teruo Hirayama, both of Kanagawa, Japan

[73] Assignee: Sony Corporation, Tokyo, Japan

[21] Appl. No.: 783,209

[22] Filed: Jan. 14, 1997

[30] Foreign Application Priority Data

Jan. 17, 1996 [JP] Japan ................................ 8-006116

[51] Int. Cl.[6] ........................................... G11C 11/00
[52] U.S. Cl. .................... 365/156; 365/154; 257/537; 257/904
[58] Field of Search ................................. 365/154, 156; 257/537, 903, 904

[56] References Cited

U.S. PATENT DOCUMENTS

| | | | |
|---|---|---|---|
| 5,153,852 | 10/1992 | Terrell | 365/154 |
| 5,377,140 | 12/1994 | Usuki | 365/154 |
| 5,570,311 | 10/1996 | Ema et al. | 365/154 |

*Primary Examiner*—David C. Nelms
*Assistant Examiner*—Hoai V. Ho
*Attorney, Agent, or Firm*—Hill & Simpson

[57] ABSTRACT

A static random access memory device (SRAM) keeping a resistance value of a resistance element at a predetermined level regardless a process variation, by improving a special margin of a diffusion layer region at which the resistance element is formed and a node for connecting a gate electrode thereto. In the SRAM, there is provided a diffusion layer region in a substrate, having a first part of which may form a the resistance element, a second part of which is connected to the drain or source of the MIS access transistor, and a third part of which is connected to the source or drain of the MIS driver transistor and is defined the node, and there is provided an electrode layer connecting the gate of the MIS driver transistor and the node in the diffusion layer region. The diffusion layer region is formed so that the diffusion layer region is bent at the first part which may form the resistance element and is defined the node and a first direction between the first part and the second part and a second direction between the first part and the third part intersect at an obtuse angle.

14 Claims, 6 Drawing Sheets

STATIC RANDOM ACCESS MEMORY SEMICONDUCTOR LAYOUT

BACKGROUND OF THE INVENTION

1. Field of the Invention

The present invention relates to a semiconductor memory device, more particularly, a static random access memory (static RAM or SRAM) in which the increase of the resistance due to a shift of alignment of a pattern during production can be prevented.

2. Description of the Related Art

SRAMs operate at a high speed and do not consume large electric power. From the view point of this low power consumption, SRAMs have extensively employed as memory devices in portable electronic (or electric) apparatuses such as a portable computer or moving electronic apparatus such as a moving portable small telephone. Since a power source of such portable electronic apparatus or moving electric apparatus is normally a battery (or a power cell), there is required a SRAM operable at a low voltage as low as possible and a low power consumption.

FIG. 1 is a circuit diagram of a SRAM in which a high resistance load or a thin film transistor (TFT) as an active load element of each of inverter circuits INV1 and INV2.

The SRAM shown in FIG. 1 comprises a bit memory cell formed at an intersection point of a bit line BL and a word line WL. The memory cell comprises a first inverter circuit INV1 and a second inverter circuit INV2. The first inverter circuit INV1 is formed by a load element HR1 formed by a high resistance load element or a TFT, and a driver transistor TR1. The second inverter circuit INV2 is also formed by a load element HR2 formed by a high resistance load element or a TFT, and a driver transistor TR2. The memory cell further comprises a first access (switching) transistor TR3 connected between the bit line BL and the word line WL, and a second access (switching) transistor TR4 connected between the bit line BL and the word line WL. The memory cell comprises a first resistance element R1 provided between a first node N1 of the first inverter circuit INV1 and the first access transistor TR3, and a second resistance element R2 provided between a second node N2 of the second inverter circuit INV2 and the second access transistor TR4.

In the memory cell, the high resistance loads HR1 and HR2 are provided as the active load elements of the first and second inverter circuits INV1 and INV2, but the TFTs can be provided as the active load elements.

In the memory cell, resistance elements R1 and R2 are provided as passive loads.

The access transistors TR3 and TR4 are energized to function as transfer gates to a memory portion of the memory cell, and thus these access transistors can be called as "transfer transistors" or merely "switching transistors".

FIG. 2 is a plan view of the memory cell to of the SRAM shown in FIG. 1. Note, in FIG. 2, the layout (pattern) of only diffusion layer regions, gate electrodes formed by polycide, generally, and buried (or embedded) contracts, of the transistors TRI to TR4 shown in FIG. 1, is illustrated. The bit line BL intersects the word line WL, but the bit line BL is formed at a layer different to another layer of the word line, and the bit line BL is not illustrated for simplifying the illustration.

The access transistor TR3 operatively connecting the bit line BL and the node N1 of the first inverter circuit INV1 is connected to a source (or drain) of the driver transistor TR1 of the first inverter circuit INV1 through a first connection diffusion layer region CDR1 a part of which forms the resistance element R1. The access transistor TR4 connecting the bit line BL and the node N2 of the second inverter circuit INV2 is connected to a source (or drain) of the driver transistor TR2 of the second inverter circuit INV2 through the second connection diffusion layer region CDR2 a part of which forms the resistance element R2.

The nodes N1 and N2, which are part of the diffusion layer regions CDR1 and CDR2, are respectively connected to gate electrodes PS2 and PS1 of the driver transistors TR2 and TR1 of the inverter circuits INV2 and INV1. The access transistors TR3 and TR4 are connected to the word line WL at shaded portions of the diffusion layer regions CDR1 and CDR2 in FIG. 2.

Sidewalls SW, illustrated by double lines in FIG. 2, are formed at circumference edges of the gate electrodes PS1 and PS2 and the word line WL. Birdbeaks BB are formed at boundary positions between the diffusion layers illustrated by dotted points in FIG. 2 and the field oxide layers.

During the production process of the SRAM shown in FIG. 2, an alignment of the driver transistors TR1 and TR2 and the gate electrodes PS1 and PS2 may be shifted.

The shift of the alignment by which the overlapping area of the first connection diffusion region CDR1 and the gate electrode PS2 will be increased, will be described.

A diffusion layer is not formed on the substrate positioned beneath the gate electrode PS2, but the concentration (density) of the diffusion layers of the substrate beneath the sidewalls SW which are formed as a LDD structure for a hot carrier countermeasure, is low. Therefore, if a portion of the connection diffusion layer region CDR1 forming the resistance element RI and connecting the access transistor TR3 and the driver transistor TRI, which is pointed out by an arrow in FIG. 2, is shifted to the upper side as shown in FIG. 3, namely, the gate electrode PS2 is shifted to the upper side, the width of the connection diffusion layer region CDR1 becomes narrow to result in the increase of the resistance value thereat. This increase of the resistance means the increase of the resistance value of the resistance element R1, in the circuit of FIG. 1. The increase of the resistance value of the resistance element R1 disturbs the rise of the potential at the node N1 to a rated level. This disturbance of the rise of the potential requires a high voltage for raising the potential at the node N1 to the rated level. As a result, the SRAM does not operate at a low voltage.

Contrarily, if the gate electrode PS2 is shifted to the lower side in FIG. 2, the resistance value of the resistance element R2 will be increased to disturb the rise of the potential at the node N2 to a rated level. Consequently, the SRAM does not operate at a low voltage.

FIG. 4 is a plan view of another memory cell pattern of the SRAM shown in FIG. 1.

In FIG. 4, the access transistors TR3 and TR4 are connected by a second connection diffusion layer region 2CDR. The diffusion layer region 2CDR is connected to a bit line contact BC. The access transistor TR3 and the driver transistor TRI of the inverter circuit INV1 are connected through a first connection diffusion layer region 1CDR.

In the SRAM shown in FIG. 4, the shift of the alignment, by which the overlapping area of the first connection diffusion layer region 1CDR and the gate electrode PS2 will be increased, may occur. When such shift of the alignment occurs, the width of the first connection diffusion layer region 1CDR forming the resistance element R1 and connecting the access transistor TR3 and the driver transistor TR1 of the inverter circuit INV1 may be narrow and the resistance value thereat may be increased. That is, the resistance value of the resistance element R1 may be increased to disturb the rise of the potential at the node N1 of the inverter circuit INV1. The SRAM does not operate at a low level.

Contrary to the above, if the gate electrode PS2 is shifted to the lower side in FIG. 4, the resistance of the resistance element R2 may be increased to disturb the rise of the potential at the node N2. Consequently, the SRAM does not operate at a low voltage.

SUMMARY OF THE INVENTION

An object of the present invention is to provide a SRAM operable at a low voltage.

Another object of the present invention is to provide a SRAM having a margin to the process variation to achieve stable operation of the SRAM.

According to the present invention, there is provided a static random access memory device comprising a plurality of memory portions, each memory portion including a word line (WL), a pair of bit lines (BL), a first inverter circuit (INV1) including a first load element (HR1) provided between a first power source (Vcc) and a first node (N1), and a first metal insulation semiconductor type (MIS) driver transistor (TR1) provided between the first node and a second power source (GND), a second inverter circuit (INV2) including a second element (HR2) provided between the first power source (Vcc) and a second node (N2), and a second MIS driver transistor (TR2) provided between the second node and the second power source (GND), a first MIS access transistor (TR3), a gate of which is connected to the word line (WL), a source or drain of which is connected to a first bit line of the pair of bit lines, a first resistance element (R1) as a passive load connected between a drain or source of the first MIS access transistor (TR3) and the first node (N1), a second MIS access transistor (TR4), a gate of which is connected to the word line (WL), a source or drain of which is connected to a second bit line of the pair of bit lines, and a second resistance element (R2) as a passive load connected between a drain or source of the second MIS access transistor (TR4) and the second node (N2), a gate of the first MIS driver transistor (TR1) being connected to the second node (N2), a gate of the second MIS drive transistor (TR2) being connected to the first node (N1).

In the SRAM, there is provided a first diffusion layer region (CDR1) in a substrate, the diffusion layer region having a first part at which the first resistance element (R1) is formed, a second part of which is connected to the drain or source of the first MIS access transistor (TR3), and a third part of which is connected to the source or drain of the first MIS driver transistor (TR1) and is defined the first node (N1), and a second diffusion layer region (CDR2) in the substrate, the diffusion layer region having a first part at which the second resistance element (R2) is formed, a second part of which is connected to the drain or source of the second MIS access transistor (TR1), and a third part of which is connected to the source or drain of the second MIS driver transistor (TR2) and is defined the second node (N2). There is also provided a first electrode layer (PS1) connecting the gate of the first MIS driver transistor (TR1) and the second node (N2) in the second diffusion layer region (CDR2), and a second electrode layer (PS2) connecting the gate of the second MIS driver transistor (TR2) and the first node (N1). The first diffusion layer region is formed so that the first diffusion layer region is bent at the first part which forms the first resistance element and is defined as the first node (N1) and a first direction between the first part and the second part and a second direction between the first part and the third part intersect at a first obtuse angle, and the second diffusion layer region is formed so that the second diffusion layer region is bent at the first part which forms the second resistance element and is defined the second node (N2), and a first direction between the first part and the second part and a second direction between the first part and the third part intersect at a second obtuse angle.

Preferably, the first and second obtuse angles are respectively approximately 100 degree to 130 degree.

Also, preferably, the width of the first part of the first diffusion layer region is sufficient thick to provide a desired resistance of the first resistance element and to connect the second electrode (PS2) to the first node (N1), and the width of the first diffusion layer region is sufficient thick to provide a desired resistance of a second resistance element and to connect the first electrode (PS1) to the second node (N2).

Also, in accordance with the present invention, there is provided a first diffusion layer region (1CDR, 2CDR, 2CDRs), a first part of which forms the first resistance element (R1), a second part of which is connected to the drain or source of the first MIS access transistor (TR3), and a third part of which is connected to the source or drain of the first MIS driver transistor (TR1) and is defined the first node (N1), and a second diffusion layer region (1CDR, 2CDR, 2CDRs), the diffusion layer region having a first part, a second part of which is connected to the drain or source of the second MIS access transistor (TR3), and a third part of which is connected to the source or drain of the second MIS driver transistor (TR1) and is defined the second node (N2). There is also provided a first electrode layer (PS1) connecting the gate of the first MIS driver transistor (TR1) and the second node (N2), and a second electrode layer (PS2) connecting the gate of the second MIS driver transistor (TR2) and the first node (N1). The first diffusion layer is formed so that the first diffusion layer is bent at the first part forming the first resistance element, and a first direction between the first part and the second part and the second direction between the first part and the third part intersect at a first acute angle, and the second diffusion layer is formed so that the first diffusion layer is bent at the first part forming the second resistance element, and a first direction between the first part and the second part and the second direction between the first part and the third part intersect at a second acute angle. A line connecting the gate of the first access transistor (TR3) and the gate of the first driver transistor (TR1) is perpendicularly intersected to the line of the word line, and a line of the gate of the second access transistor (TR4) and the gate of the second driver transistor (TR2) is perpendicularity intersected to the line of the word line.

Preferably, the first and second acute angles are respectively approximately 50 degree to 80 degree.

Also, preferably, the width of the first part of the first diffusion layer region is sufficient thick to provide a desired resistance of the first resistance element and to connect the second electrode (PS2) to the first node (N1), and the width of the first diffusion layer region is sufficient thick to provide a desired resistance of the second resistance element and to connect the first electrode (PS1) to the second node (N2).

BRIEF DESCRIPTION OF THE DRAWINGS

The above and other objects and features of the present invention will be apparent by the following description with reference to the accompanying drawings, in which.

DESCRIPTION OF THE PREFERRED EMBODIMENTS

A static random access memory (SRAM) will be described as preferred embodiments of a semiconductor memory device in accordance with the present invention.

Figure 1:
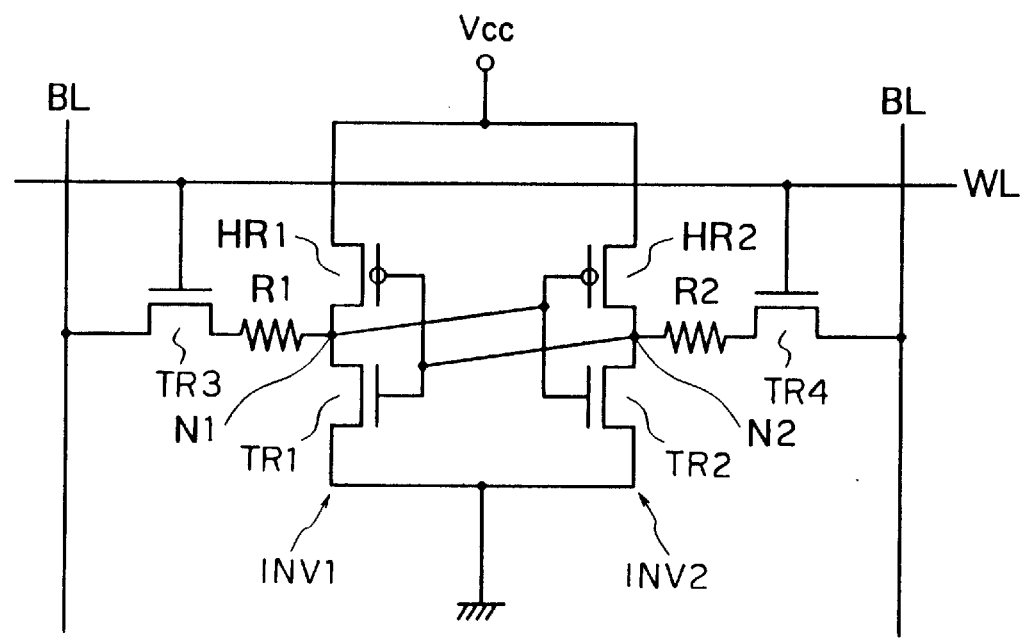
FIG. 1 is a circuit diagram of a SRAM.

The circuit of the SRAM shown in FIG. 1 is applied to the preferred embodiments of the present invention. A variety of memory cell patterns of the embodiments of the present invention will be described.

Figure 5:
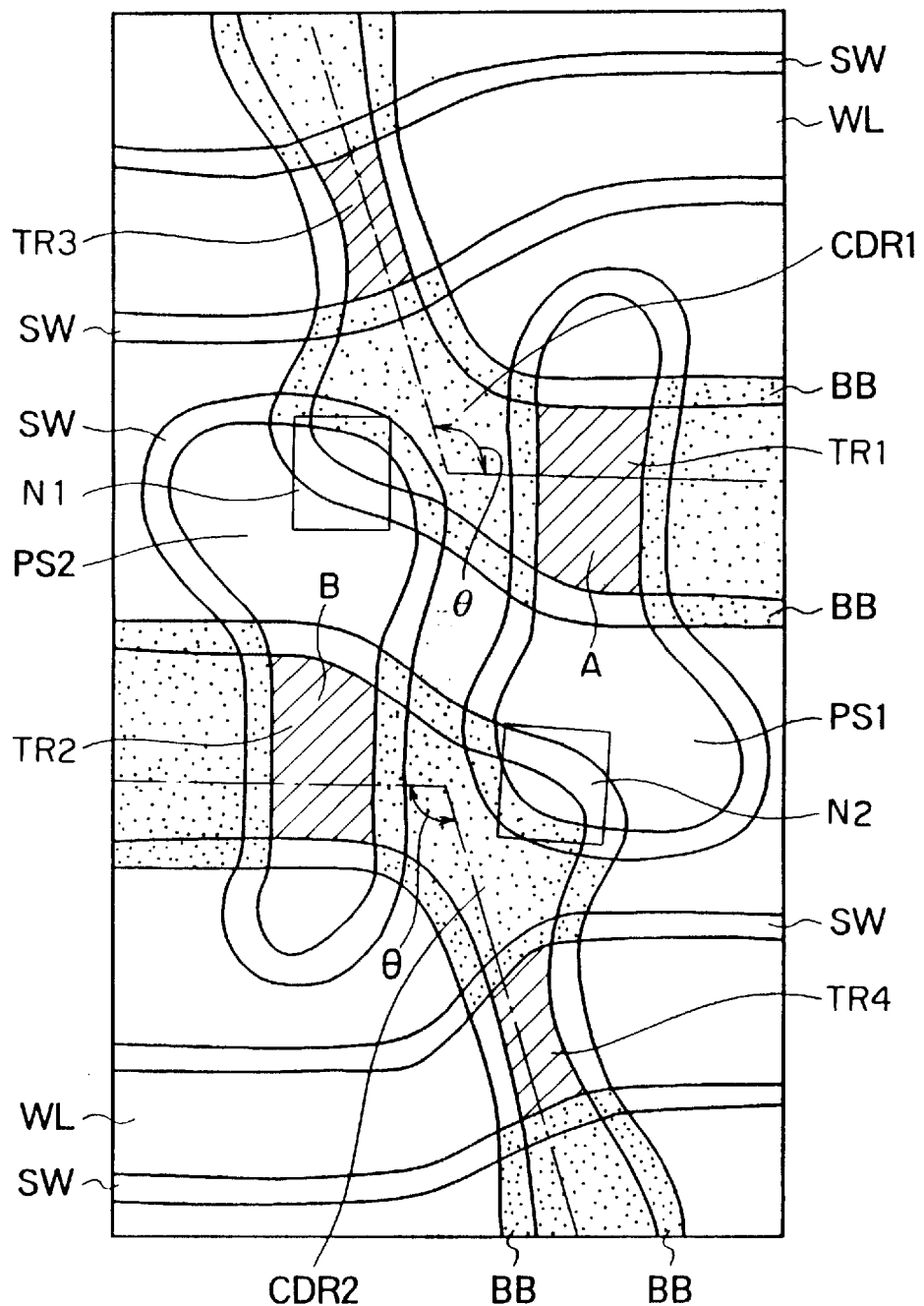
FIG. 5 is a plan view of a first pattern of the SRAM as a first embodiment in accordance with the present invention.

FIG. 5 is a plan view of a first memory cell pattern of the SRAM illustrated in FIG. 1.

In FIG. 5, a word line WL and a bit line BL (not shown) perpendicularly intersected. Parts of the word lines WL function as gate electrodes of access (or switching) transistors TR3 and TR4. The access transistor TR3 and a driver transistor TR1 of the first inverter circuit INV1 are connected though a first connection diffusion layer region CDR1. The access transistor TR4 and a driver transistor TR2 of the inverter circuit INV2 are connected though a second connection diffusion layer region CDR2.

The respective gate electrodes PS1 and PS2 of the driver transistors TR1 and TR2 are connected to the respective diffusion layer regions CDR2 and CDR1.

At side walls of the gate electrodes PS1 and PS2 and the word lines WL, LDD sidewalls SW for a hot carrier countermeasure are formed. The impurity concentration (density) at a substrate beneath the sidewalls SW is low. Birdbeaks BB are formed at ends of field oxide films for separating the diffusion regions illustrated by dotted points.

In the diffusion layer regions CDR1 and CDR2, the resistance elements R1 and R2 as the passive loads of FIG. 1 are formed.

Figure 2:
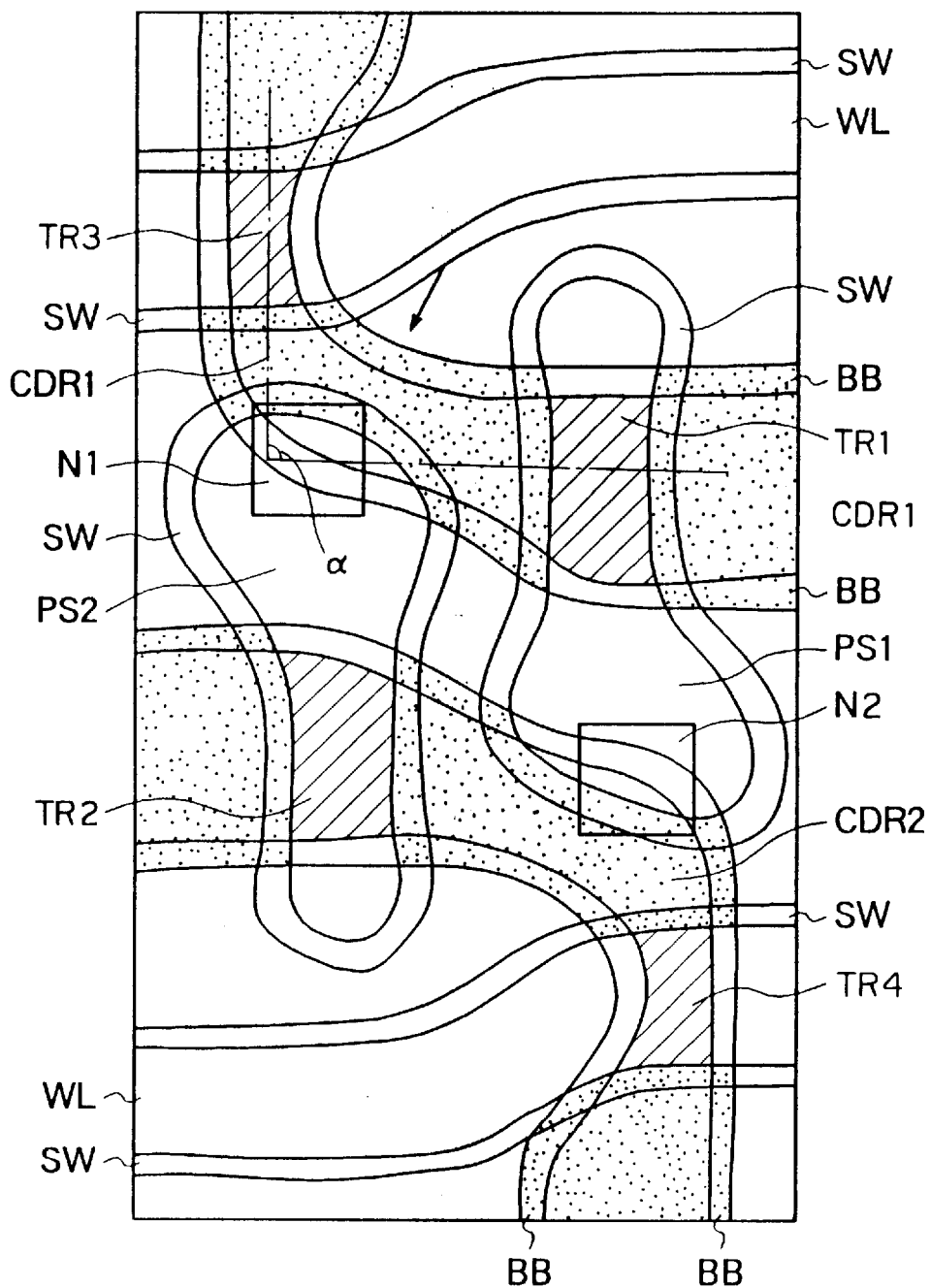
FIGS. 2 to FIG. 4 are plan views of conventional patterns of the SRAM of FIG. 1.
Figure 3:
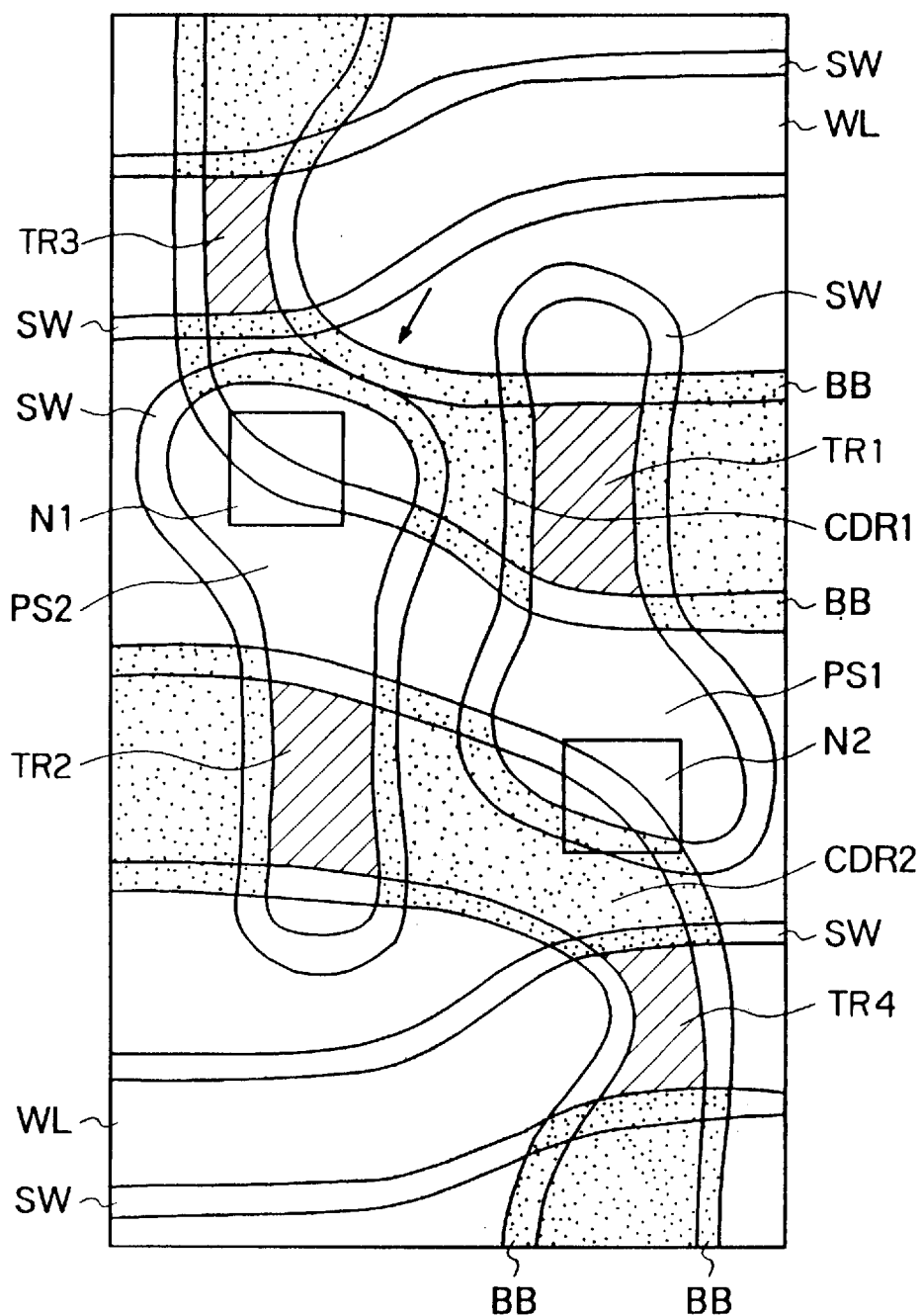

As shown in FIG. 2 and FIG. 3, since the diffusion layers are not formed in the substrate beneath the electric conductive layers connected to diffusion layer regions CDR1 and CDR2, narrower widths of the diffusion layer regions are not avoidable.

In the embodiment, the drain (or source) of the access transistor TR3 and the source (or drain) of the driver transistor TR1 are connected at the diffusion layer region CDR1 a part of which is the resistance element R1 and is defined as the node N1. The direction of a first part of the diffusion layer region CDR1 at which the transistor TR3 is connected thereto is perpendicularly intersect to the direction of the word line WL. The direction of a second part of the diffusion layer region CDR1 at which the transistor TR1 is connected thereto is parallel to the word line WL. The directions of the first part and the second part of the diffusion layer region CDR1 cross at a corner close to the node N1 at an angle θ. Note, the angle θ is an obtuse angle of 110 in this embodiment. The obtuse angle may be 100° to 130°. Contrary to this, such crossing angle α of FIG. 2 is a right angle. Further, in FIG. 5, the corner (bent) portion of the diffusion layer region CDR1, at which the gate electrode PS2 is overlapped and the node N1 is defined, is thick and thus provides a margin to the position shift of the gate electrode PS2. Contrary to this, in FIG. 2, the corner (bent) portion of the diffusion layer region does not have such margin. Further, the length of the diffusion layer region CDR1 can be shortened.

Namely, in the embodiment, by forming the diffusion layer region CDR1 of which the first and second parts intersect at an obtuse angle at the corner (bent) portion at which the gate electrode PS2 is connected thereto, the width of the corner portion becomes wide to increase the margin to the position shift of alignment of the gate electrode PS2. As a result, even if the position shift of the alignment of the gate electrode PS2 and the diffusion layer region CDR1 due to the process variation may, the resistance of the resistance element R1 can be maintained at the design value, and thus, the instability of the operation of the SRAM is avoided and the SRAM operates at a low voltage. The power consumption of the SRAM can be reduced. The voltage of a battery for normal operation and/or stand-by operation can also be lowered.

The above structure can also be expressed as that the direction of the arrangement of the source diffusion layer, the gate electrode PS2 and the drain diffusion layer of the access transistor TR3, and the direction of the arrangement of the source diffusion layer, the gate electrode and the drain diffusion layer of the drive transistor TR1 are intersected at the corner (bent) portion of the diffusion layer region CDR1 at an obtuse angle. The corner portion forms the resistance element R1.

The above discussed structures and features (advantages) of the transistors TR1 and TR3 and the diffusion layer region CDR1 are similarly applied to the transistors TR2 and TR4 and the diffusion layer regions CDR2.

A second embodiment of the present invention will be described with reference to FIG. 6.

Figure 4:
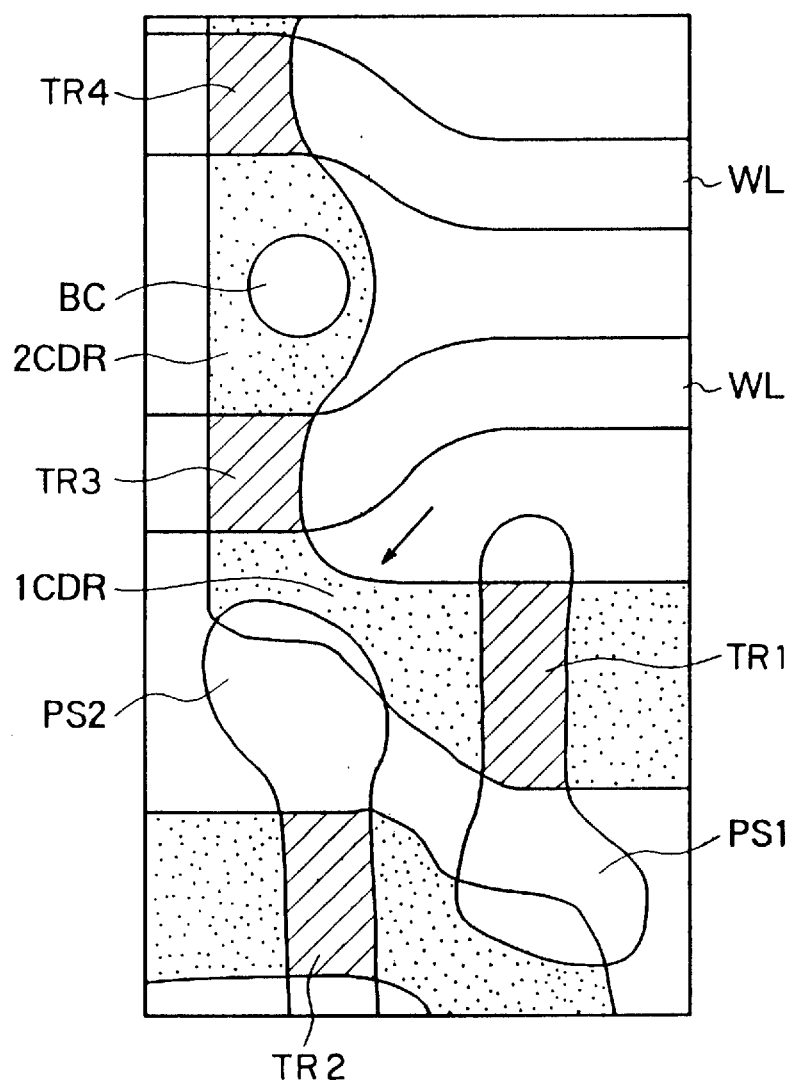
Figure 6:
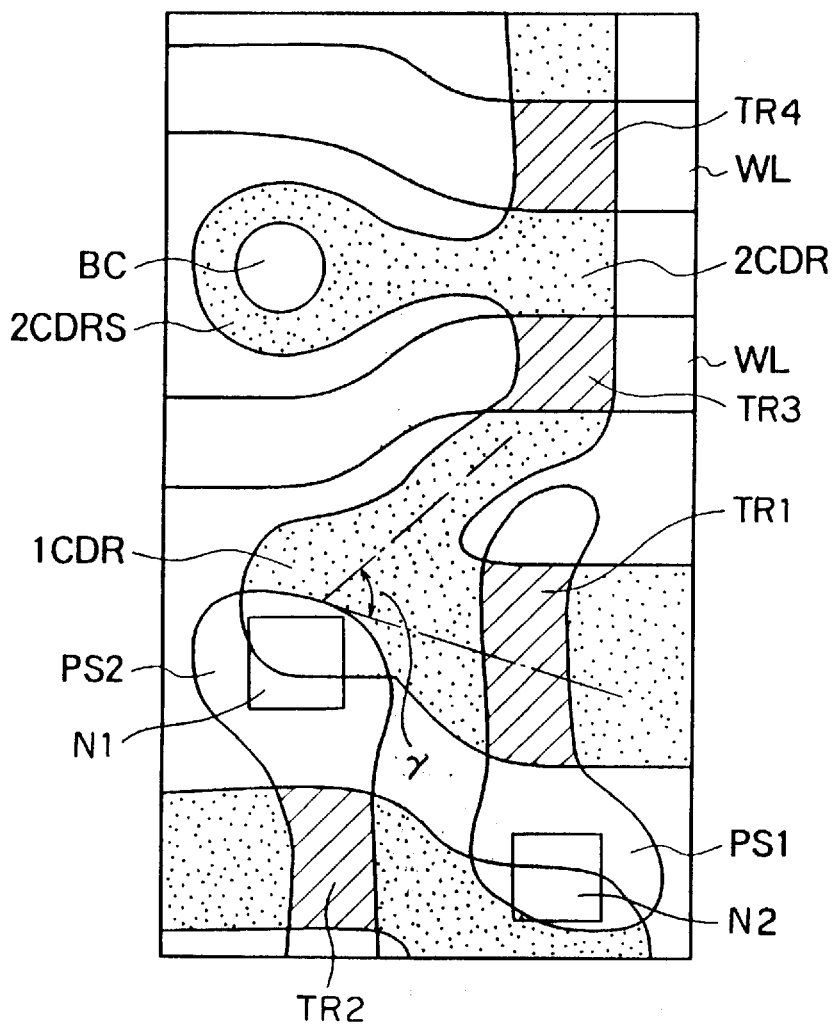
FIG. 6 is a plan view of a second pattern of the SRAM as a second embodiment in accordance with the present invention.

FIG. 6 is a plan view of another memory cell pattern of the SRAM shown in FIG. 1 and corresponds to FIG. 4. The memory cell pattern of FIG. 6 is an improvement of that of FIG. 4.

In FIG. 6, a word lines WL and a bit line BL (not shown) are perpendicularly intersected. The word lines WL form as the gate electrodes of the access transistors TR3 and TR4. Note, the access transistor TR4 is an access transistor TR4 for a neighboring memory cell. The access transistor TR4 for this memory cell will be positioned at a position symmetrically to the illustrated access transistor TR4 with respect to the node N1. But, the access transistor TR4 for this memory cell is not illustrated. The access transistors TR3 and TR4 are connected by a second connection diffusion layer 2CDR. The positions of the access transistor TR3 and TR4 are shifted to the right and upper portion to those of FIG. 2. The access transistors TR3 and TR4 are connected to a second connection diffusion layer region 2CDR by an extended portion 2CDRS of the second connection diffusion layer region 2CDR.

The access transistor TR3 and the driver transistor TR1 are connected by the first connection diffusion layer region 1CDR. The gate electrode PS1 of the driver transistor TR1 is connected to a diffusion layer of the driver transistor TR2, and the gate electrode PS2 of the transistor TR2 is connected to the first connection diffusion layer region 1CDR.

The first diffusion layer region 1CDR is bent at a portion where the gate electrode PS2 is connected thereto and the width of which is thick at an acute angle γ. The acute angle γ is 70° in this embodiment, and may be 50° to 80°. As a result, if the position shift of the alignment of the gate electrode PS2 of the driver transistor TR2 may occur to increase the overlapping width of the gate electrode PS2 to the first diffusion layer region CDR1, the increase of the resistance of the resistance element R2, due to not existence of a diffusion layer in the substrate beneath the gate electrode PS2, can be avoided.

In the embodiment, since there is provided the acute angle bent portion of the first diffusion layer region 1CDR at which the node N1 is defined, the position change of the transistors TR3 and TR4 to the driver transistor TR1 must be done. This results in the separation in distance between the bit contact BC and the second diffusion layer region 2CDR. Then, there is provided the extension portion 2CDRS of the second diffusion layer region 2CDR for connecting the bit contact BC and the second diffusion layer region 2CDR.

In the second embodiment, the position shift of alignment of the gate electrode PS2 of the driver transistor TR2 during the production is not subjected. Therefore, if the process variation occur, the stability of the operation of the SRAM can be maintained, and the SRAM operates at a low voltage and consumes a small power. Of course, the voltage of a battery for the normal operation and/or back-up operation can be lowered, and low voltage batteries can be applied to the SRAM.

What is claimed is:

1. A static random access memory device comprising a plurality of memory portions, said memory portions comprising:

a word line, a pair of bit lines, a first inverter circuit including a first load element provided between a first power source and a first node, and a first driver transistor provided between the first node and a second power source, a second inverter circuit including a second load element provided between the first power source and a second node, and a second driver transistor provided between the second node and the second power source, a first access transistor, a gate of which is connected to the word line, a source or drain of which is connected to a first bit line of the pair of bit lines, a first resistance element, connected between a drain or source of the first access transistor and the first node, a second access transistor, a gate of which is connected to the word line, a source or drain of which is connected to a second bit line of the pair of bit lines, and a second resistance element, connected between a drain or source of the second access transistor and the second node, a gate of the first driver transistor connected to the second node, a gate of the second drive transistor connected to the first node;

wherein a first diffusion layer region in a substrate, has a first part at which the first resistance element is formed, a second part of which is connected to the drain or source of the first access transistor, and a third part of which is connected to the source or drain of the first driver transistor and defines the first node, and a second diffusion layer region in the substrate having a first part at which the second resistance element is formed, a second part of which is connected to the drain or source of the second access transistor, and a third part of which is connected to the source or drain of the second driver transistor and defines the second node, wherein a first electrode layer connecting the gate of the first driver transistor and the second node in the second diffusion layer region, and a second electrode layer connect the gate of the second driver transistor and the first node, and wherein the first diffusion layer region is formed so that the first diffusion layer region is bent at the first part which forms the first resistance element and defines the first node and a first direction between the first part and the third part intersect at a first obtuse angle, and the second diffusion layer region is formed so that the second diffusion layer region is bent at the first part which forms the second resistance element and defines the second node, and a first direction between the first part and the second part and a second direction between the first part and the third part intersect at a second obtuse angle.

2. The static random access memory device according to claim 1, wherein the first and second obtuse angles are respectively approximately 100 degree to 130 degree.

3. The static random access memory device according to claim 1, wherein a width of the first part of the first diffusion layer region is sufficiently thick to provide a desired resistance of the first resistance element and to connect the second electrode to the first node, and wherein the width of the first diffusion layer region is sufficiently thick to provide a desired resistance of the second resistance element and to connect the first electrode to the second node.

4. A static random access memory device comprising a plurality of memory portions, said memory portions including:

a word line, a pair of bit lines, a first inverter circuit including a first load element provided between a first power source and a first node, and a first driver transistor provided between the first node and a second power source, a second inverter circuit including a second load element provided between the first power source and a second node, and a second driver transistor provided between the second node and the second power source, a first access transistor, a gate of which is connected to the word line, a source or drain of which is connected to a first bit line of the pair of bit lines, a first resistance element as a passive load, connected between a drain or source of the first access transistor and the first node, a second access transistor, a gate of which is connected to the word line, a source or drain of which is connected to a second bit line of the pair of bit lines, and a second resistance element as a passive load, connected between a drain or source of the second access transistor and the second node, a gate of the first drive transistor connected to the second node, a gate of the second drive transistor connected to the first node, wherein a first diffusion layer region has a first part at which the first resistance element is formed, a second part of which is connected to the drain or source of the first access transistor, and a third part of which is connected to the source or drain of the first driver transistor and defines the first node, and a second diffusion layer region having a first part at which the second resistance element is formed, a second part of which is connected to the drain or source of the second access transistor, and a third part of which is connected to the source or drain of the second driver transistor and defines the second node, wherein a first electrode layer connects the gate of the first driver transistor and the second node, and a second electrode layer connects the gate of the second driver transistor and the first node, wherein the first diffusion layer is formed so that the first diffusion layer is bent at the first part forming the first resistance element, and a first direction between the first part and the second part and the second direction between the first part and the third part intersect at a first acute angle, and the second diffusion layer is bent at the first part forming the second resistance element, and a first direction between the first part and the second part and the second direction between the first part and the third part intersect at a second acute angle, and wherein a line connecting the gate of the first access transistor and the gate of the first driver transistor perpendicularly intersect the line of the word line, and a line of the gate of the second driver transistor perpendicularly intersect the line of the word line.

5. The static random access memory device according to claim 4, wherein the first and second acute angles are respectively approximately 50 degree to 80 degree.

6. The static random access memory device according to claim 4, wherein a width of the first part of the first diffusion layer region is sufficiently thick to provide a desired resistance of a first resistance element and to connect the second electrode to the first node, and wherein the width of the first diffusion layer is sufficiently thick to provide a desired resistance of the second resistance element and to connect the first electrode to the second node.

7. A memory device comprising:

first and second word line portions, wherein the first word line portion has a first lengthwise direction which is substantially parallel to a lengthwise direction of the second word line portion;

first and second connection diffusion layer regions each comprised of first and second lengthwise portions, wherein the first lengthwise portion of the first connection diffusion layer region is substantially perpendicular to the first word line portion, and the second lengthwise portion of the first connection diffusion layer region is substantially parallel to the lengthwise direction of the first word line and an angle between the first and second lengthwise portions of the first connection diffusion layer region is substantially greater than 90 degrees.

8. The memory device of claim 7, wherein the first lengthwise portion of the second connection diffusion layer region is substantially perpendicular to the second word line portion, and the second lengthwise portion of the second connection diffusion layer region is substantially parallel to the lengthwise direction of the second word line and an angle between the first and second lengthwise portions of the second connection diffusion layer region is substantially greater than 90 degrees.

9. The memory device of claim 7, wherein an intersection between the first connection diffusion layer region and the first word line portion occurs at a bend in the first word line portion.

10. The memory device of claim 8, wherein an intersection between the second connection diffusion layer region and the second word line portion occurs at a bend in the first word line portion.

11. The memory device of claim 8, wherein an intersection between the first connection diffusion layer region and the first word line portion occurs at a bend in the first word line portion and an intersection between the second connection diffusion layer region and the second word line portion occurs at a bend in the first second word line portion.

12. The memory device of claim 7, wherein the first lengthwise portion of the first connection diffusion layer is connected to a drain or source of a first access transistor and the second lengthwise portion of the first connection diffusion layer region is connected to a source or drain of a first drive transistor.

13. The memory device of claim 8, wherein the first lengthwise portion of the first connection diffusion layer is connected to a drain or source of a first access transistor and the second lengthwise portion of the first connection diffusion layer region is connected to a source or drain of a first drive transistor.

14. The memory device of claim 13, wherein the first lengthwise portion of the second connection diffusion layer is connected to a drain or source of a second access transistor and the second lengthwise portion of the second connection diffusion layer region is connected to a source or drain of a second drive transistor.

* * * * *